(12) United States Patent
Akhbari et al.

(10) Patent No.: US 12,066,338 B2
(45) Date of Patent: Aug. 20, 2024

(54) FORCE-MEASURING DEVICE ASSEMBLY FOR A PORTABLE ELECTRONIC APPARATUS, A PORTABLE ELECTRONIC APPARATUS, AND A METHOD OF MODIFYING A SPAN OF A SENSE REGION IN A FORCE-MEASURING DEVICE ASSEMBLY

(71) Applicant: UltraSense Systems, Inc., San Jose, CA (US)

(72) Inventors: Sina Akhbari, San Jose, CA (US); Ching-hsun Wei, Taichung (TW); Shao-Hsiang Lo, Taoyuan (TW); Hao-Yen Tang, San Jose, CA (US)

(73) Assignee: UltraSense Systems, Inc., San Jose, CA (US)

( * ) Notice: Subject to any disclaimer, the term of this patent is extended or adjusted under 35 U.S.C. 154(b) by 283 days.

(21) Appl. No.: 17/739,946

(22) Filed: May 9, 2022

(65) Prior Publication Data
US 2022/0364939 A1 Nov. 17, 2022

Related U.S. Application Data

(60) Provisional application No. 63/187,051, filed on May 11, 2021.

(51) Int. Cl.
*G01L 1/16* (2006.01)
*B81B 3/00* (2006.01)
(Continued)

(52) U.S. Cl.
CPC .............. *G01L 1/16* (2013.01); *B81B 3/0021* (2013.01); *H10N 30/302* (2023.02);
(Continued)

(58) Field of Classification Search
CPC ........ G01L 1/16; H10N 30/302; H10N 30/87; H10N 30/88; B81B 3/0021; B81B 2201/0292
See application file for complete search history.

(56) References Cited

U.S. PATENT DOCUMENTS

| 4,412,544 A | 11/1983 | Beretsky et al. |
| 8,676,540 B1 | 3/2014 | Welch et al. |
(Continued)

FOREIGN PATENT DOCUMENTS

WO WO2018077761 5/2018

*Primary Examiner* — Octavia Davis Hollington
(74) *Attorney, Agent, or Firm* — Perkins Coie LLP

(57) ABSTRACT

A force-measuring device (FMD) assembly for a portable electronic apparatus includes a mid-frame including a base portion, a sidewall portion, and a transition region between the base portion and the sidewall portion, and force-measuring devices coupled to the inner surface of the sidewall portion. The sidewall portion and the transition region are elongate along a longitudinal axis. FMDs are coupled to the inner surface at respective contact regions of the sidewall portion and are separated from each other along the longitudinal axis. Each of the FMDs includes strain-sensing element(s). Each of the FMDs corresponds to a respective sense region of the sidewall portion. The transition region includes a respective elongate slit or trough for each of the sense regions. The respective elongate slit or trough is elongate along the longitudinal axis. Adjacent elongate slits or troughs are separated by a respective rib.

33 Claims, 14 Drawing Sheets

(51) Int. Cl.
  *H10N 30/30*     (2023.01)
  *H10N 30/87*     (2023.01)
  *H10N 30/88*     (2023.01)
(52) U.S. Cl.
  CPC .............. *H10N 30/87* (2023.02); *H10N 30/88* (2023.02); *B81B 2201/0292* (2013.01)

(56) References Cited

U.S. PATENT DOCUMENTS

| | | | |
|---|---|---|---|
| 9,092,653 B2* | 7/2015 | Setlak | G06V 40/1306 |
| 10,203,790 B2* | 2/2019 | Han | G06F 3/0446 |
| 10,438,040 B2* | 10/2019 | Strohmann | G06F 3/0436 |
| 10,466,844 B1 | 10/2019 | Tang et al. | |
| 10,585,534 B2 | 3/2020 | Tang et al. | |
| 10,719,175 B2 | 7/2020 | Akhbari et al. | |
| 10,775,938 B2 | 9/2020 | Tang et al. | |
| 11,681,399 B2* | 6/2023 | Tang | G06F 3/044 |
| | | | 345/174 |
| 11,719,671 B2* | 8/2023 | Akhbari | G06F 3/043 |
| | | | 73/627 |
| 11,803,274 B2* | 10/2023 | Chen | G06F 3/043 |
| 11,822,635 B2* | 11/2023 | Jin | G06V 40/1365 |
| 11,835,400 B2* | 12/2023 | Tu | G01L 5/167 |
| 2001/0000666 A1 | 5/2001 | Wood et al. | |
| 2002/0005108 A1 | 1/2002 | Ludwig | |
| 2003/0144814 A1 | 7/2003 | Hama et al. | |
| 2003/0217873 A1 | 11/2003 | Paradiso et al. | |
| 2003/0233233 A1 | 12/2003 | Hong | |
| 2007/0260425 A1 | 11/2007 | Kim | |
| 2008/0316184 A1 | 12/2008 | D'Souza | |
| 2009/0157206 A1 | 6/2009 | Weinberg et al. | |
| 2009/0224161 A1 | 9/2009 | Fritsch et al. | |
| 2010/0117993 A1 | 5/2010 | Kent | |
| 2010/0139991 A1 | 6/2010 | Phillip et al. | |
| 2010/0258361 A1 | 10/2010 | Yamauchi et al. | |
| 2011/0061464 A1 | 3/2011 | Yi-min | |
| 2012/0274609 A1 | 11/2012 | Sheng et al. | |
| 2013/0345864 A1 | 12/2013 | Park et al. | |
| 2014/0022189 A1 | 1/2014 | Sheng et al. | |
| 2014/0071095 A1 | 3/2014 | Godsill | |
| 2015/0148674 A1 | 5/2015 | Park et al. | |
| 2015/0169136 A1 | 6/2015 | Ganti et al. | |
| 2016/0216794 A1 | 7/2016 | Yoon et al. | |
| 2016/0246449 A1 | 8/2016 | Jarske | |
| 2017/0110504 A1 | 4/2017 | Panchawagh et al. | |
| 2017/0255338 A1 | 9/2017 | Medina | |
| 2017/0322290 A1 | 11/2017 | Ng et al. | |
| 2017/0336903 A1 | 11/2017 | Rivaud et al. | |
| 2017/0336926 A1 | 11/2017 | Chaudhri et al. | |
| 2017/0364726 A1* | 12/2017 | Buchan | H10N 30/87 |
| 2018/0032161 A1 | 2/2018 | Shi et al. | |
| 2018/0032211 A1 | 2/2018 | King | |
| 2018/0039392 A1 | 2/2018 | Kim et al. | |
| 2018/0164937 A1 | 6/2018 | Lynn | |
| 2018/0246612 A1 | 8/2018 | Lynn et al. | |
| 2018/0276439 A1 | 9/2018 | Strohmann et al. | |
| 2018/0276440 A1 | 9/2018 | Strohmann et al. | |
| 2018/0284892 A1 | 10/2018 | Kwon et al. | |
| 2018/0323783 A1 | 11/2018 | Bang et al. | |
| 2019/0050618 A1 | 2/2019 | Khuri-Yakub | |
| 2019/0074833 A1 | 3/2019 | Sheng | |
| 2019/0354209 A1 | 11/2019 | Tang et al. | |
| 2019/0354210 A1 | 11/2019 | Akhbari et al. | |
| 2019/0354237 A1 | 11/2019 | Tang et al. | |
| 2019/0354238 A1 | 11/2019 | Akhbari et al. | |
| 2021/0181041 A1 | 6/2021 | Tang | |
| 2021/0239553 A1 | 8/2021 | Akhbari et al. | |
| 2021/0242393 A1 | 8/2021 | Tang | |
| 2021/0278926 A1 | 9/2021 | Akhbari et al. | |
| 2021/0293641 A1 | 9/2021 | Tu et al. | |
| 2021/0293648 A1 | 9/2021 | Tu et al. | |

* cited by examiner

FORCE-MEASURING DEVICE ASSEMBLY FOR A PORTABLE ELECTRONIC APPARATUS, A PORTABLE ELECTRONIC APPARATUS, AND A METHOD OF MODIFYING A SPAN OF A SENSE REGION IN A FORCE-MEASURING DEVICE ASSEMBLY

CROSS-REFERENCE TO RELATED APPLICATION(S)

This application claims the benefit of U.S. Provisional Patent Application No. 63/187,051 filed on May 11, 2021, entitled "FORCE-MEASURING DEVICE ASSEMBLY FOR A PORTABLE ELECTRONIC APPARATUS, A PORTABLE ELECTRONIC APPARATUS, AND A METHOD OF MODIFYING A SPAN OF A SENSE REGION IN A FORCE-MEASURING DEVICE ASSEMBLY," which is incorporated herein by reference in its entirety.

BACKGROUND

Virtual buttons can be configured using force-measuring devices that include strain-sensing elements coupled to a suitable cover layer. It would be desirable to configure such virtual button in a portable electronic apparatus, such as a smartphone. Typically, most of the front side of a smartphone is taken up by a display. This leaves narrow side portions of the smartphone between the front side and the back side that is usable for virtual buttons. Data obtained from strain-sensing elements may vary markedly depending upon locations of force-imparting points. Accordingly, there is a need to modify a span of a sense region in a force-measuring device assembly.

SUMMARY OF THE INVENTION

In one aspect, a force-measuring device assembly for a portable electronic apparatus includes a mid-frame including a base portion, a sidewall portion, and a transition region between the base portion and the sidewall portion, and a plurality of force-measuring devices. The sidewall portion includes an outer surface facing away from the base portion and inner surface opposite the outer surface. The sidewall portion and the transition region are elongate along a longitudinal axis. Each of the force-measuring devices is coupled to the inner surface at a respective contact region of the sidewall portion and arranged such that the force-measuring devices are separated from each other along the longitudinal axis. Each of the force-measuring devices includes at least one strain-sensing element configured to output voltage signals in accordance with a time-varying strain at each respective strain-sensing element. Each of the force-measuring devices corresponds to a respective sense region of the sidewall portion. Each of the sense regions includes one or more contact regions. The transitions region includes a respective elongate slit or trough for each of the sense regions. The respective elongate slit or trough is elongate along the longitudinal axis. Adjacent elongate slits or troughs are separated by a respective rib.

In another aspect, a portable electronic apparatus includes a front panel including a main display, a back panel, a mid-frame including a base portion, a sidewall portion, and a transition region between the base portion and the sidewall portion, and a plurality of force-measuring devices. The sidewall portion includes an outer surface facing away from the base portion and inner surface opposite the outer surface. The sidewall portion and the transition region are elongate along a longitudinal axis. Each of the force-measuring devices is coupled to the inner surface at a respective contact region of the sidewall portion and arranged such that the force-measuring devices are separated from each other along the longitudinal axis. The sidewall portion extends between the front panel and the back panel along a transverse axis perpendicular to the longitudinal axis. Each of the force-measuring devices includes at least one strain-sensing element configured to output voltage signals in accordance with a time-varying strain at each respective strain-sensing element. Each of the force-measuring devices corresponds to a respective sense region of the sidewall portion. Each of the sense regions includes one or more contact regions. The transition region includes a respective elongate slit or trough for each of the sense regions. The respective elongate slit or trough is elongate along the longitudinal axis. Adjacent elongate slits or troughs are separated by a respective rib. The outer surface of the sidewall portion is exposed to the outside of the portable electronic apparatus and the transition region and the base portion are not exposed to the outside of the portable electronic apparatus.

In yet another aspect, a method of modifying a span of a sense region in a force-measuring device assembly includes steps (A), (B), (C), and (D). Step (A) includes configuring a mid-frame including a base portion, a sidewall portion, and a transition region between the base portion and the sidewall portion. The sidewall portion includes an outer surface facing away from the base portion and an inner surface opposite the outer surface. The sidewall portion and the transition region are elongate along a longitudinal axis. The base portion extends along the longitudinal axis. The sidewall portion extends along a transverse axis perpendicular to the longitudinal axis. Step (B) includes configuring a plurality of force-measuring devices. Each of the force-measuring devices includes at least one strain-sensing element configured to output voltage signals in accordance with a time-varying strain at each respective strain-sensing element. Step (C) includes configuring a respective elongate slit or trough in the transition region for each of the sense regions. The respective elongate slit or trough is elongate along the longitudinal axis. Adjacent elongate slits or troughs are separated by a respective rib. Step (D) includes coupling each of the force-measuring devices to the inner surface at a respective contact region of the sidewall portion adjacent to the respective elongate slit or trough and arranging the force-measuring devices such that they are separated from each other along the longitudinal axis. Each of the sense regions includes one or more contact regions.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to a force-measuring device assembly for a portable electronic apparatus, a portable electronic apparatus, and a method of modifying a span of a sense region in a force-measuring device assembly.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
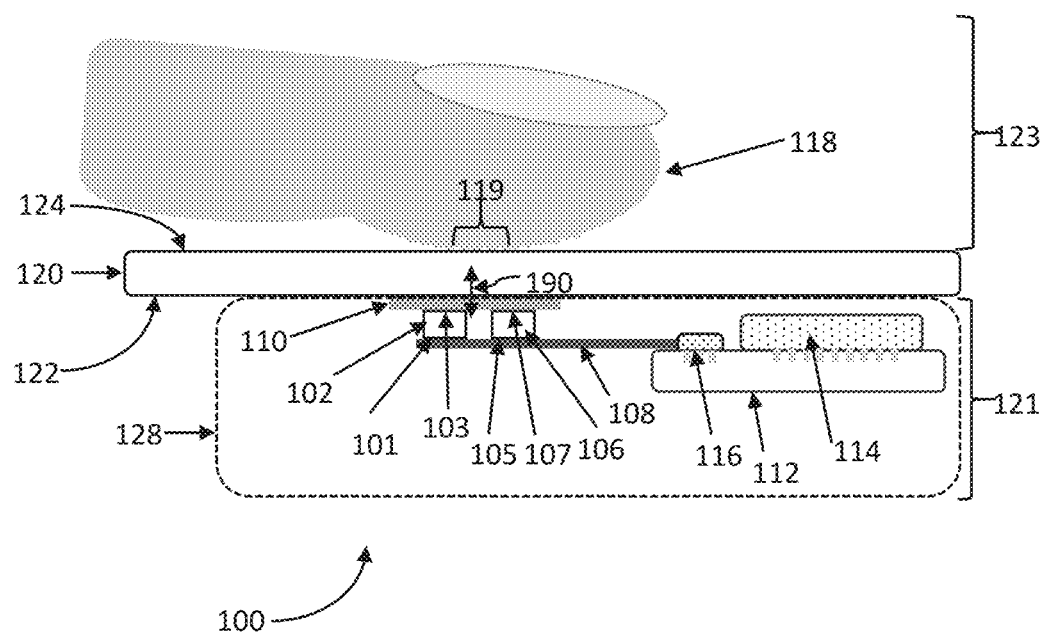
FIG. 1 is a schematic view of an illustrative input system.

FIG. 1 is a schematic view of an input system 100. In the example shown, the input system 100 includes force-measuring devices (102, 106) that are implemented as packaged integrated circuits (ICs) additionally including touch-sensing functionality. Typically, the touch-sensing functionality is realized using ultrasonic transducers. Such devices that include touch-sensing functionality are sometimes referred to as force-measuring and touch-sensing integrated circuits (FMTSICs). A force-measuring device includes at least one strain-sensing element configured to output voltage signals in accordance with a time-varying strain at each respective strain-sensing element. For example, the strain-sensing element can be a piezoelectric micromechanical force-measuring element (PMFE) or a piezoresistive element. In the example shown, PMFEs are used in the force-measuring devices 102, 106. Each of the force-measuring devices 102, 106 has an electrical interconnection surface (bottom surface) 101, 105 and a top surface 103, 107. The force-measuring devices 102, 106 are mounted to a flexible circuit substrate (flexible circuit) 108 (e.g., an FPC or flexible printed circuit) on the electrical interconnection surfaces 101, 105. The flexible circuit substrate 108 is electrically and mechanically connected to a printed circuit board (PCB) 112 via a connector 116. Other ICs 114 are mounted on the PCB 112, and such other ICs 114 could be a microcontroller (MCU), microprocessor (MPU), and/or a digital signal processor (DSP), for example. These other ICs 114 could be used to run programs and algorithms to analyze and categorize touch events based on data received from the force-measuring devices 102, 106. Other ICs 114 can also be mounted to the flexible circuit. Generally, signal processing circuitry can be implemented in the force-measuring devices (102, 106) and/or the ICs 114. The signal processing circuitry can be implemented in a single IC, or in multiple ICs.

Input system 100 includes a cover layer 120 having an exposed outer surface 124 and an inner surface 122 opposite the outer surface. The cover layer 120 should be robust but should be sufficiently deformable such that a deformation of the cover layer is transmitted to the piezoelectric micromechanical force-measuring elements (PMFEs) in the force-measuring device, as described with reference to FIG. 4. FIG. 1 shows an example of a force-imparting point 119, which is an area where the finger 118 imparts a force to the cover layer 120 when touching, tapping, and/or pressing. The cover layer 120 can be a robust material that deforms when pressed by the finger 118. Examples of such robust materials are wood, glass, metal, plastic, leather, fabric, and ceramic. The cover layer 120 could also be a composite stack of any of the foregoing materials. The force-measuring devices 102, 106 are adhered to or attached to the inner surface 122 of the cover layer 120 by a layer of adhesive 110, for example. The choice of adhesive 110 is not particularly limited as long as the devices 102, 106 remain attached to the cover layer. The adhesive 110 could be double-sided tape, pressure sensitive adhesive (PSA), epoxy adhesive, or acrylic adhesive, for example. More generally, force-measuring devices 102, 106 are mechanically coupled to the inner surface 122 in the sense that a mechanical deformation of the cover layer is transmitted to the force-measuring devices 102, 106. In some embodiments, the force-measuring device includes ultrasonic transducers. Ultrasonic transducers that can be fabricated using microelectromechanical systems (MEMS) technologies include piezoelectric micromechanical ultrasonic transducers (PMUTs) and capacitive micromechanical ultrasonic transducers (CMUTs). Since PMFEs, PMUTs, and CMUTs can be made using MEMS technology, it is possible to make a force-measuring device that incorporates both force-measuring elements (e.g., PMFEs) and ultrasonic transducers (e.g., PMUTs, CMUTs). Accordingly, a force-measuring device that additionally incorporates touch-sensing functionality is feasible. Such a force-measuring device, additionally incorporating touch-sensing functionality, in an integrated circuit form can be referred to as a force-measuring and touch-sensing integrated circuit or FMTSIC.

System 100 can be implemented in numerous apparatuses. For example, the force-measuring devices 102, 106 can replace conventional buttons on Smartphones, keys on computer keyboards, sliders, or track pads. The interior contents 128 of an apparatus (e.g., force-measuring device 102, 106, flexible circuit substrate 108, connector 116, PCB 112, ICs 114) can be sealed off from the exterior 123 of the cover layer 120, so that liquids on the exterior 123 cannot penetrate into the interior 121 of the apparatus. The ability to seal the interior of the system from the outside helps to make the apparatus, such as a Smartphone or laptop computer, waterproof. There are some applications, such as medical applications, where waterproof buttons and keyboards are strongly desired. The apparatus can be a mobile appliance (e.g., Smartphone, tablet computer, laptop computer), a household appliance (e.g., television, washing machine, dryer, light switches, air conditioner, refrigerator, oven, remote controller devices), a medical appliance, an industrial appliance, an office appliance, an automobile, or an airplane, for example.

Figure 2:
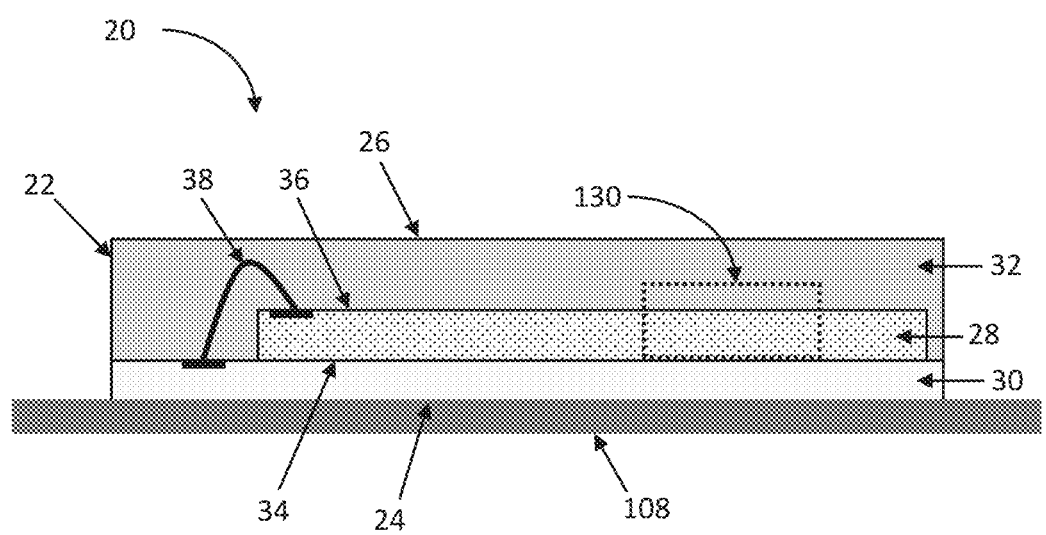
FIG. 2 is a schematic cross-sectional view of a force-measuring device.

The force-measuring device is shown in greater detail in FIG. 2. FIG. 2 is a cross-sectional view of a force-measuring device 20, which is one possible implementation of force-measuring device 102, 106 in FIG. 1. Force-measuring device 20 is shown encased in a package 22, with a top surface 26 and electrical interconnection surface (bottom surface) 24. Top surface 26 is analogous to surfaces 103, 107 in FIG. 1 and electrical interconnection surface 24 is analogous to surfaces 101, 105 in FIG. 1. The force-measuring device 20 includes a package substrate 30, semiconductor die (semiconductor chip) 28 mounted to the package substrate 30, and an encapsulating adhesive 32, such as an epoxy adhesive. After the semiconductor die 28 is mounted to the package substrate 30, wire bond connections 38 are formed between the die 28 and the package substrate 30. Then the entire assembly including the die 28 and the package substrate 30 are molded (encapsulated) in an epoxy adhesive 32. In the example shown in FIG. 1, the epoxy side (top surface 26) of the force-measuring device 102 is adhered to (coupled to) the inner surface 122 of the cover layer 120. The force-measuring device 102, 106 is shown mounted to the flexible circuit substrate 108. It is preferable that the force-measuring device have lateral dimensions no greater than 10 mm by 10 mm. In the example shown, the wire bond connection 38 is formed between the top surface 36 of the semiconductor die 28 and the package substrate 30. Alternatively, electrical interconnections can be formed between the bottom surface 34 of the semiconductor die 28 and the package substrate. The semiconductor die 28 consists of an application-specific integrated circuit (ASIC) portion and a micro-electromechanical systems (MEMS) portion. A selected portion 130 of the semiconductor die 28 is shown in cross-section in FIG. 3.

Figure 3:
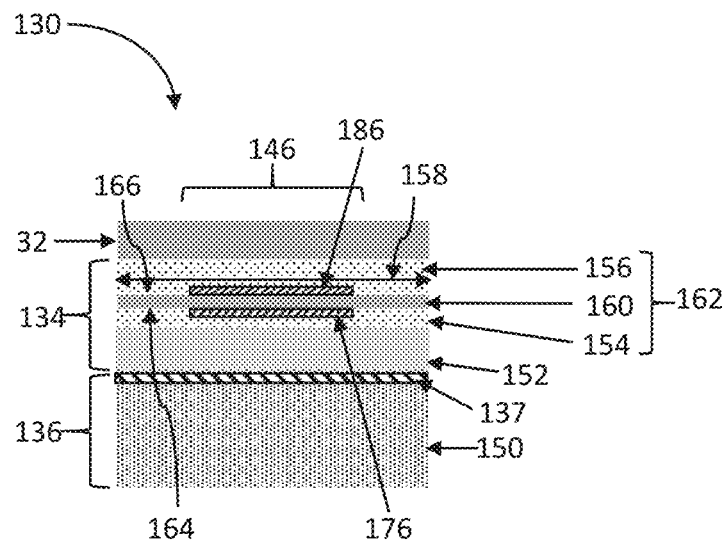
FIG. 3 is a schematic cross-sectional view of a piezoelectric micromechanical force-measuring element (PMFE) of the force-measuring device of FIG. 2.

FIG. 3 is a schematic cross-sectional view of a portion 130 of the force-measuring device 20 of FIG. 2. The semiconductor die 28 includes a MEMS portion 134 and an ASIC portion 136 underneath the PMFE 146. Also shown is an encapsulating adhesive 32 that is above the PMFE 146. Comparing the ASIC portion 136 and the MEMS portion 134, the MEMS portion 134 is closer to the top surface 26 and the ASIC portion 136 is closer to the electrical interconnection surface 24. The ASIC portion 136 consists of a semiconductor substrate 150 and signal processing circuitry 137 thereon or therein. Typically, the semiconductor substrate is a silicon substrate, but other semiconductor substrates such as silicon-on-insulator (SOI) substrates can also be used.

The MEMS portion 134 includes a PMFE 146. The MEMS portion 134 includes a thin-film piezoelectric stack 162 overlying the semiconductor substrate 150. The thin-film piezoelectric stack 162 includes a piezoelectric layer 160, which is a layer exhibiting the piezoelectric effect. Suitable materials for the piezoelectric layer 160 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, and $Bi_{0.5}Na_{0.5}TiO_3$ (BNT), for example. For example, the piezoelectric layer is a layer of aluminum nitride having a thickness of approximately 1 μm. The piezoelectric layer 160 has a top major surface 166 and a bottom major surface 164 opposite the top major surface 166. In the example shown, the thin-film piezoelectric stack 162 additionally includes a top mechanical layer 156, attached to or adjacent to (coupled to) top major surface 166, and a bottom mechanical layer 154, attached to or adjacent to (coupled to) bottom major surface 164. In the example shown, the thickness of the top mechanical layer 156 is greater than the thickness of the bottom mechanical layer 154. In other examples, the thickness of the top mechanical layer 156 can be smaller than the thickness of the bottom mechanical layer 154. Suitable materials for the mechanical layer(s) are silicon, silicon oxide, silicon nitride, and aluminum nitride, for example. Suitable materials for the mechanical layer(s) can also be a material that is included in the piezoelectric layer 160, which in this case is aluminum nitride. In the example shown, the top mechanical layer and the bottom mechanical layer contain the same material. In other examples, the top mechanical layer and the bottom mechanical layer are of different materials. In other examples, the top mechanical layer or the bottom mechanical layer can be omitted. The mechanical layer(s) adjust the mechanical properties of the thin-film piezoelectric stack 162. When coupled to the cover layer, the force-measuring device 20 is preferably oriented such that the piezoelectric layer 160 faces toward the cover layer 120. For example, the force-measuring device 20 is oriented such that the piezoelectric layer 160 and the cover layer 120 are approximately parallel.

For ease of discussion, only one PMFEs is shown in FIG. 3. However, a typical force-measuring device may contain multiple PMFEs. The PMFEs are located at respective lateral positions along the thin-film piezoelectric stack 162. An insulating support layer 152 supports the thin-film piezoelectric stack. Suitable materials for the support layer 152 are silicon, silicon nitride, and silicon oxide, for example. Suitable materials for the support layer 152 can also be a material that is included in the piezoelectric layer 160, which in this case is aluminum nitride.

Each PMFE 146 includes a respective portion of the thin-film piezoelectric stack 162. Each PMFE 146 includes a first PMFE electrode 176 positioned on a first side (bottom surface) 164 of the piezoelectric layer 160 and a second PMFE electrode 186 positioned on a second side (top surface) 166 opposite the first side. The first PMFE electrode 176 and the second PMFE electrode 186 are positioned on opposite sides of the piezoelectric layer 160. In each PMFE 146, the first PMFE electrode 176, the second PMFE electrode 186, and the portion of the piezoelectric layer 160 between them constitute a piezoelectric capacitor. The PMFEs are coupled to the signal processing circuitry 137 as explained in detail hereinbelow.

Figure 4:
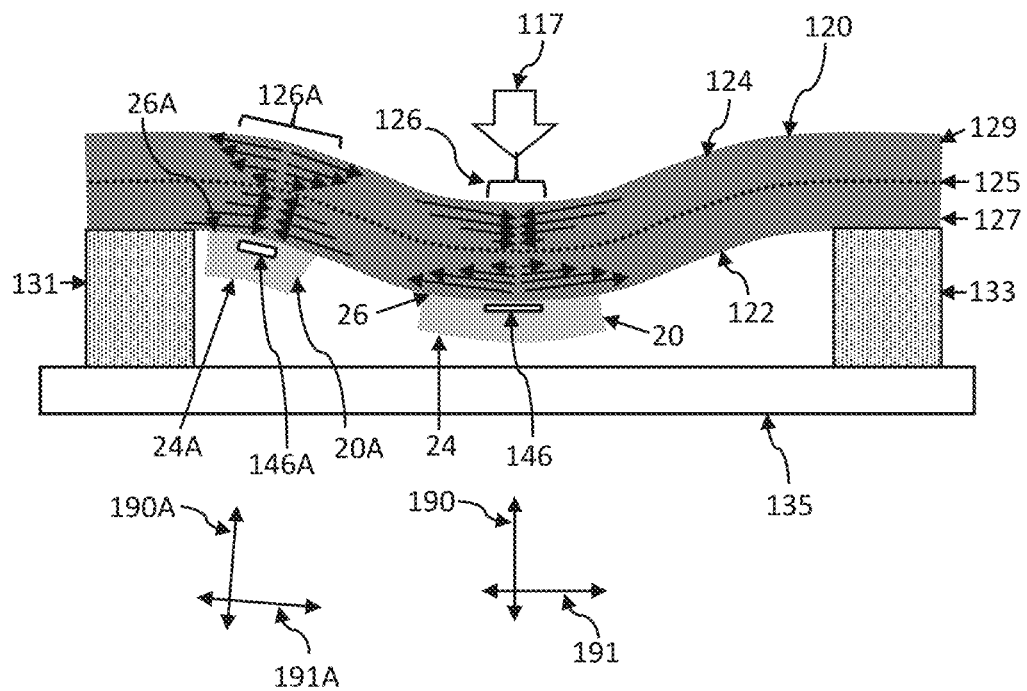
FIG. 4 is a schematic side view of force-measuring device(s) and a cover layer, attached to each other and undergoing deformation.

FIG. 3 shows the PMFE in a quiescent state, in which there is no flexing of the piezoelectric stack 162. In the quiescent state, there is no voltage generated between the PMFE electrodes (176, 186). FIG. 4 is a schematic side view of a force-measuring device 20 and a cover layer 120 attached to or adhered to (coupled to) each other. A top surface 26 of force-measuring device 20 is coupled to inner surface 122 of the cover layer 120. Force-measuring device 20 and cover layer 120 overlie a rigid substrate 135. For ease of viewing, other components of system 100 (e.g., flexible circuit substrate 108, ICs 114) have been omitted. Force-measuring device 20 includes PMFEs 146. In the example shown, two anchor posts 131, 133 fix the two ends of the cover layer 120 to the substrate 135.

In the example of FIG. 4, force-measuring device 20 is not anchored to the rigid substrate 135 and can move with the cover layer 120 when the cover layer 120 is deflected upwards or downwards. A downward force 117, shown as a downward arrow, is applied by a finger (or another object) pressing against the outer surface 124 of the cover layer 120 at the force-imparting point 126 for example. A finger pressing against or tapping the outer surface 124 are examples of touch excitation, or more generally, excitation. In the example shown in FIG. 4, the cover layer 120 is deflected in a first direction (e.g., downwards) in response to a touch excitation at the force-imparting point 126. Force-measuring device 20 is located approximately half-way between the anchor posts 131, 133 and force-imparting point 126 overlaps force-measuring device 20. A neutral axis 125 is located within the cover layer 120. A lower portion 127 of the cover layer 120, below the neutral axis 125, is under tensile (positive) strain at the force-imparting point 126, represented by outward pointing arrows, primarily along lateral direction 191, perpendicular to the normal direction 190. Normal direction 190 is normal to the piezoelectric layer 160. Normal direction 190 is approximately normal to a plane of the respective piezoelectric capacitor. The piezoelectric layer 160 has a built-in polarization (piezoelectric polarization) that is approximately parallel to normal direction 190. The lateral direction 191 is approximately parallel to the piezoelectric layer 160 at the respective location of the piezoelectric layer 160 (at region 126). An upper portion 129 of the cover layer 120, above the neutral axis 125, is under compressive (negative) strain at the force-imparting point 126, represented by inward pointing arrows, primarily along lateral direction 191. Since force-measuring device 20 is coupled to the lower portion 127 at the force-imparting point 126, the PMFEs 146 are also under tensile (positive) strain. Typically, the entire force-measuring device 20 may be deflected under the applied downward force 117. In the example shown in FIG. 4, the PMFEs 146 are under a positive strain, and the respective portions of the piezoelectric layer 160 at the PMFEs 146 undergo expansion along a lateral direction 191. As a result, an electrical charge is generated at each PMFE (146) between the respective PMFE electrodes (176, 186). This electrical charge is detectable as a first deflection voltage $V_{d1}$ (corresponding to strain of a certain polarity and magnitude). The polarity of the first deflection voltage $V_{d1}$ at a PMFE depends upon the polarity of the strain (positive strain (tensile) or negative strain (compressive)) at the respective portion of the piezoelectric layer between the respective PMFE electrodes of the PMFE. The magnitude of the first deflection voltage $V_{d1}$ at a PMFE depends upon the magnitude of the strain at the respective portion of the piezoelectric layer between the respective PMFE electrodes of the PMFE. Subsequently, when the downward force 117 is no longer applied to the force-imparting point 126, the cover layer 120 deflects in a second direction opposite the first direction (e.g., upwards). This is detectable as a second deflection voltage $V_{d2}$ (corresponding to strain of a certain polarity and magnitude). The polarity of the second deflection voltage $V_{d2}$ at a PMFE depends upon the polarity of the strain at the respective portion of the piezoelectric layer between the respective PMFE electrodes of the PMFE. The magnitude of the second deflection voltage $V_{d2}$ at a PMFE depends upon the magnitude of the strain at the respective portion of the piezoelectric layer between the respective PMFE electrodes of the PMFE.

FIG. 4 shows a second force-measuring device 20A, including PMFEs 146A. A top surface 26A of force-measuring device 20A is coupled to inner surface 122 of the cover layer 120. Force-measuring device 20A overlies the rigid substrate 135 and is located at a second region 126A, between anchor post 131 and first force-measuring device 20. Note that force-measuring device 20A is laterally displaced from the location where the downward force 117 is applied to the outer surface 124 (at force-imparting point 126). The lower portion 127 of the cover layer 120 is under compressive (negative) strain at the second region 126A, represented by inward pointing arrows, primarily along the lateral direction 191A, perpendicular to the normal direction 190A. The lateral direction 191A is approximately parallel to the piezoelectric layer 160 at the respective location of the piezoelectric layer 160 (at second region 126A). The upper portion 129 of the cover layer 120 is under tensile (positive) strain at the second region 126A, represented by outward pointing arrows, primarily along the lateral direction 191A. Since force-measuring device 20A is coupled to the inner surface 122, adjacent to the lower portion 127, the PMFEs 146A are also under compressive (negative) strain. These examples illustrate that when the cover layer and the force-measuring devices undergo deflection in response to a touch excitation at the outer surface, expansion and/or compression of the piezoelectric layer may be induced by the deflection of the cover layer.

In operation, PMFE 146 is configured to output voltage signals between the PMFE electrodes (176, 186) in accordance with a time-varying strain at the respective portion of the piezoelectric layer between the PMFE electrodes (176, 186) resulting from a low-frequency mechanical deformation. The low-frequency mechanical deformation can be caused by a finger pressing against or tapping at outer surface of the cover layer 120, to which the force-measuring device 20 is attached (coupled). The PMFE 146 is coupled to the signal processing circuitry 137. The signal processing circuitry is configured to read at least some of the PMFE voltage signals. By amplifying and processing the voltage signals from the PMFE at the signal processing circuitry, the strain that results from the mechanical deformation of the piezoelectric layer can be measured.

Figure 9:
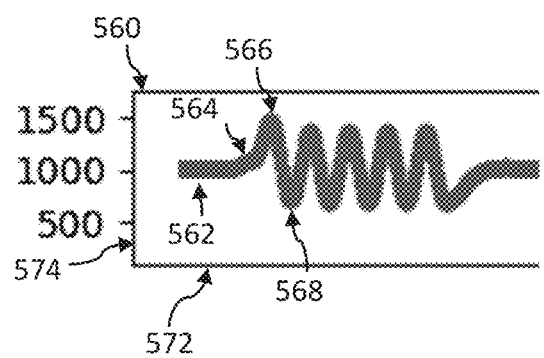
FIGS. 9 and 10 are graphical plots of force data obtained from one of the force-measuring devices in response to forces imparted at respective force-imparting points.
Figure 10:
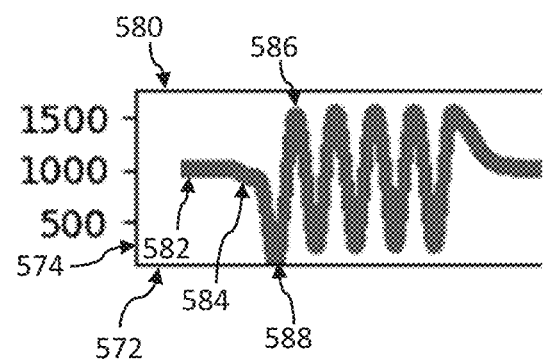

Typically, the low-frequency deformation is induced by touch excitation which is not repetitive or is repetitive having a repetition rate of 100 Hz or less, or 10 Hz or less. These repetition rates correspond to the repetition rates of a repetitive touch excitation, e.g., a finger repeatedly pressing against or tapping at a force-imparting point. Illustrative force data measured during a repetitive touch event (finger touching and pressing the cover layer repeatedly) is shown in FIGS. 9 and 10.

Figure 5:
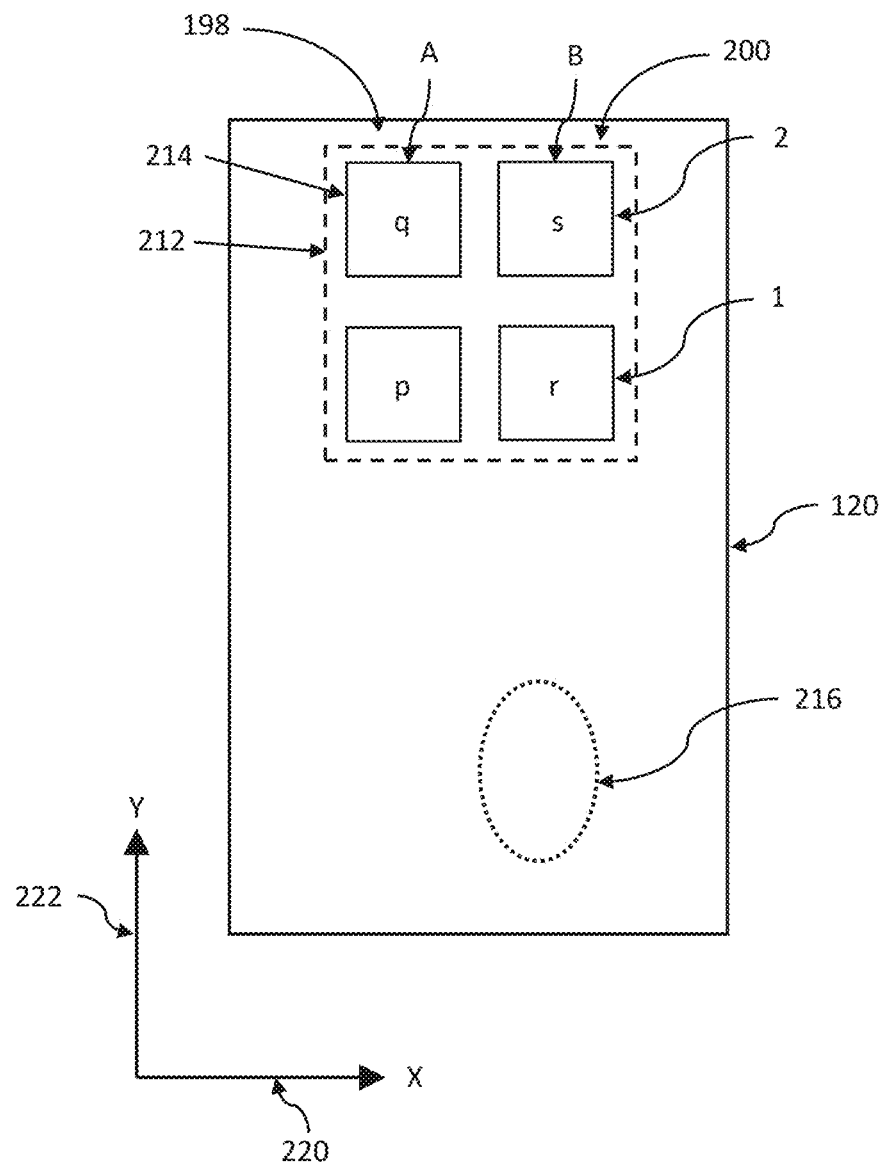
FIG. 5 is a schematic top view of PMFE array of a force-measuring device.

A force-measuring device may contain multiple PMFEs. FIG. 5 is a top view of an example MEMS portion 200 of a force-measuring device 198. The MEMS portion 200 includes four PMFEs (214, locations identified as p, q, r, and s) arranged in a two-dimensional array 212 extending along the X-axis (220) and Y-axis (222). The PMFEs are arranged in columns (A and B) and rows (1 and 2). In the example shown, the two-dimensional PMFE array 212 has a square outer perimeter, but in other examples the outer perimeter can have other shapes such as a rectangle. The force-measuring device is coupled to a cover layer 120. The cover layer 120 is shown overlying the PMFEs 214. Each PMFE measures the strain (force) at a respective X and Y location. For example, the PMFE 214 at location q measures the strain at the piezoelectric layer between the electrodes of that PMFE. Therefore, the PMFE array 212 achieves a two-dimensional positional resolution of strain (force) measurement. The force-imparting point can be any point on the cover layer, such as the PMFE's locations p, q, r, or s, or a point laterally displaced from the PMFEs 214, such as location 216. Suppose that we wish to set up a virtual button approximately corresponding to the PMFE array region 212. In this case, we would configure the PMFEs and the cover layer such that PMFE signals measured from a typical touch excitation at locations outside the PMFE array region (e.g., location 216) would be below a predetermined threshold. On the other hand, suppose that we wish to set up a virtual button approximately corresponding to the entire cover layer region 120. In this case, we would configure the PMFEs and the cover layer such that force data arising from a typical touch excitation any location within the cover layer region 120 would be above a predetermined threshold.

Figure 6:
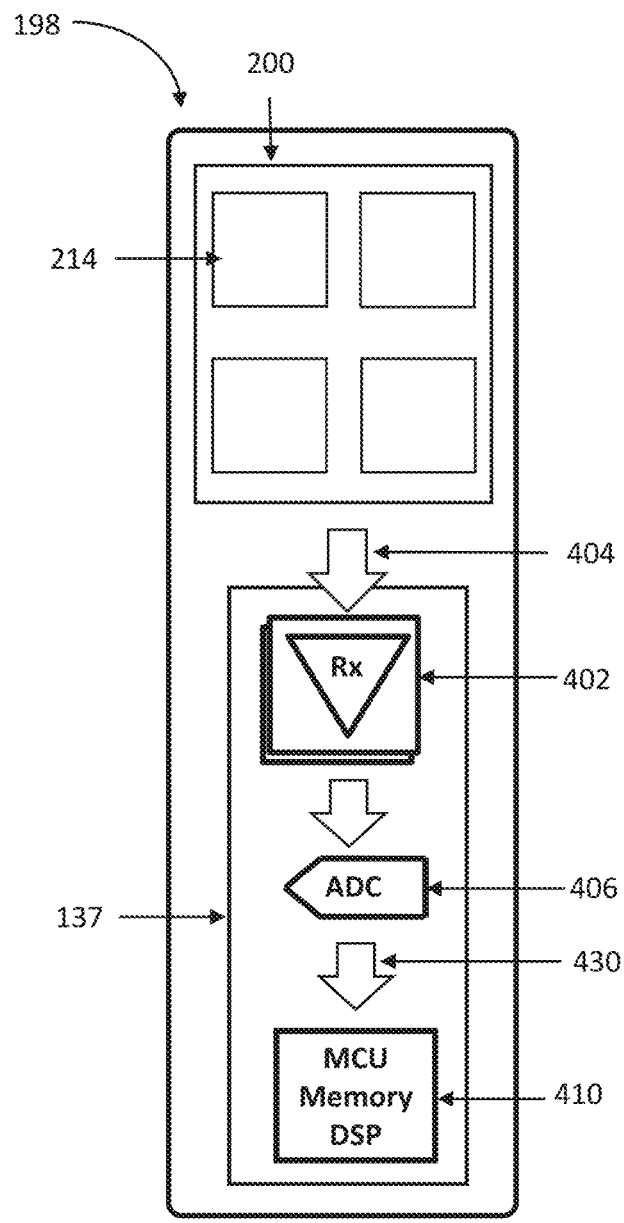
FIG. 6 is an electronics block diagram of a force-measuring device.

FIG. 6 is an electronics block diagram of the force-measuring device 198, including a MEMS portion 200 and signal processing circuitry 137. The MEMS portion includes PMFEs 214. Signal processing circuitry 137 includes amplifiers (402) and analog-to-digital converters (ADCs) (406). Voltage signals read from PMFEs 214 reach amplifiers 402 via electrical interconnections 404 and get amplified by the amplifiers 402. These amplified voltage signals are sent to ADC 406 to be converted to force data (digital transducer data) 430 which can be processed or stored by other circuit blocks 410. The other circuit blocks 410 could be microcontrollers (MCUs), memories, and digital signal processors (DSPs), for example. Force-measuring device 198 can be implemented as a semiconductor die including ASIC and MEMS portions (e.g., force-measuring device 20 of FIG. 2) or as an assembly of semiconductor and MEMS chips.

Figure 7:
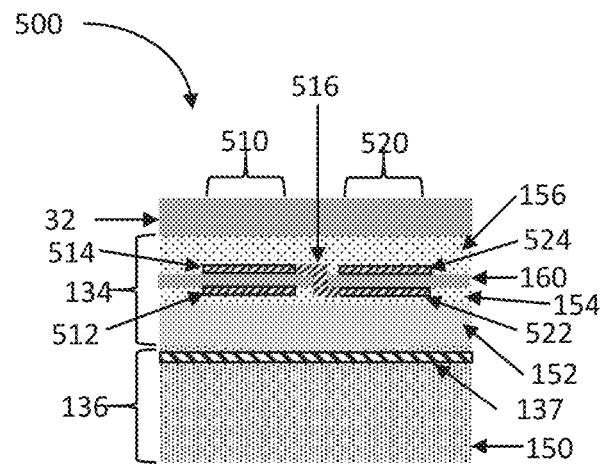
FIG. 7 is a schematic cross-sectional view of a set (pair) of PMFEs.

FIG. 7 is a schematic cross-sectional view of a set 500 of PMFEs 510 and 520. Also shown is the ASIC portion 136 that is under the PMFEs 510, 520 and the encapsulating adhesive 32 that is above the PMFEs 510 and 520. FIG. 7 shows the PMFE in a quiescent state analogous to the quiescent state described with reference to FIG. 3. A PMFE has been described with reference to FIG. 3. In the example shown (FIG. 7), the piezoelectric stack includes a piezoelectric layer 160, a top mechanical layer 156, and a bottom mechanical layer 154. In a deformed state (such as shown in FIG. 4), an electrical charge is generated between the PMFE electrodes 512 and 514 of first PMFE 510 and between the PMFE electrodes 522 and 524 of the second PMFE 520.

Figure 8:
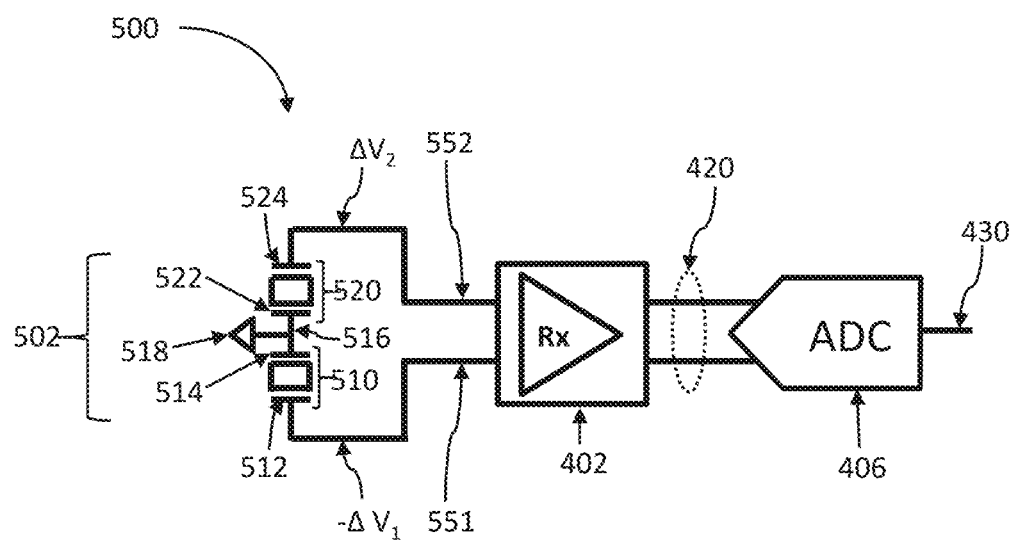
FIG. 8 is a block diagram illustrating the electrical connections of the PMFE pair of FIG. 7 to related signal processing circuitry.

For each PMFE (510, 520), the first PMFE electrode (512, 522), the second PMFE electrode (514, 524), and the respective portion of the piezoelectric layer 160 between them constitute a piezoelectric capacitor. FIG. 8 is a block diagram illustrating the electrical connections of the PMFE set (pair) to certain portions of the signal processing circuitry 137. In FIG. 8, we show each PMFE (510, 520) as a piezoelectric capacitor. PMFEs 510 and 520 are connected in series via a wire 516 that includes a via that penetrates the piezoelectric layer 160 (FIG. 7). Wire 516 connects second electrode (top electrode) 514 of first PMFE 510 to the first electrode (bottom electrode) 522 of the second PMFE 512. The outermost electrodes of the PMFE electrodes in the series 502 are first electrode 512 of the first PMFE 510 and the second electrode 524 of the second PMFE 520. These outermost electrodes of the PMFE electrodes in the series 502 are connected as differential inputs 551, 552 to the amplifier circuitry 402 of the signal processing circuitry 137. The voltage signals at inputs 551, 552 are amplified by the amplifier circuitry 402. Amplified voltage signals 420 are output from the amplifier circuitry 402 to the analog-to-digital converter (ADC) 406. Force data (digital transducer data) 430 are output from the ADC 406.

As shown in the example of FIG. 7, wire 516 is tied to a common node 518. In this case, we can refer to the node between the two adjacent PMFEs 510, 520 connected in series as a common node. If the voltage of the common node is held at 0 V, the voltage signal input to input 551 can be expressed as $-\Delta V_1$, and the voltage signal input to input 552 can be expressed as $\Delta V_2$, where the subscripts refer to the first PMFE (510) or second PMFE (520). An advantage of a node between adjacent PMFEs connected in series being a common node is that voltage offsets from the common node voltage are reduced, simplifying subsequent amplification of low-voltage signals.

FIGS. 9 and 10 show some examples of force data (digital transducer data). FIG. 9 is graphical plot 560 of force data (digital transducer data) obtained from a force-measuring device in response to a time-varying applied force imparted at a force-imparting point. For example, this force data corresponds to digital signals 430 output from the ADC 406 (FIGS. 6 and 8). For example, the force-imparting point is overlapped with the force-measuring device. The time-varying applied force consists of repetitively pressing at the force-imparting point five times. Plot 560 has a horizontal axis 572 which shows time t and a vertical axis 574 which shows force data (digital transducer data). For example, a time duration of plot 560 is 10 seconds. Before the application of the time-varying applied force, the PMFEs are in a quiescent state (plot section 562). For example, the PMFE might be in a quiescent state if there is no deformation of the cover layer. As the time-varying applied force begins, the digital transducer data show a positive slope (plot section 564) and then reaches a maximum 566, corresponding to strain of a first polarity at the PMFEs. This corresponds to the PMFEs under tension (see PMFE 146 in FIG. 4). As the pressure at the force-imparting point is released, the digital transducer data decreases from a maximum 566 to a minimum 568. Local maxima are reached five times, corresponding to repetitively pressing against the force-imparting point five times. A characteristic amplitude of the digital transducer data can be defined to be a difference between a local maximum 566 and a local minimum 568. Alternatively, a characteristic amplitude of the digital transducer data can be defined to be a difference between a global maximum and a global minimum, within a predetermined time window such as shown in FIG. 9.

FIG. 10 is graphical plot 580 of force data (digital transducer data) obtained from a force-measuring device in response to a time-varying applied force (identical to that for FIG. 9) imparted at a force-imparting point. For example, this force-imparting point is different from the force-imparting point of FIG. 9. This force-imparting point can be laterally displaced from and remote from the force-measuring device. For example, a time duration of plot 580 is 10 seconds. Before the application of the time-varying applied force, the PMFEs are in a quiescent state (plot section 582). As the time-varying applied force begins, the digital transducer data show a negative slope (plot section 584) and then reaches a local minimum 588, corresponding to strain of a second polarity at the PMFEs. This corresponds to the PMFEs under compression (see PMFE 146A in FIG. 4). As the pressure at the force-imparting point is released, the digital transducer data increases from a local minimum 588 to a local maximum 586. Local minima are reached five times, corresponding repetitively pressing against the force-imparting point five times. A characteristic amplitude of the digital transducer data can be defined to be a difference between the local maximum 586 and the local minimum 588. Alternatively, a characteristic amplitude of the digital transducer data can be defined to be a difference between a global maximum and a global minimum, within a predetermined time window such as shown in FIG. 10.

Figure 11:
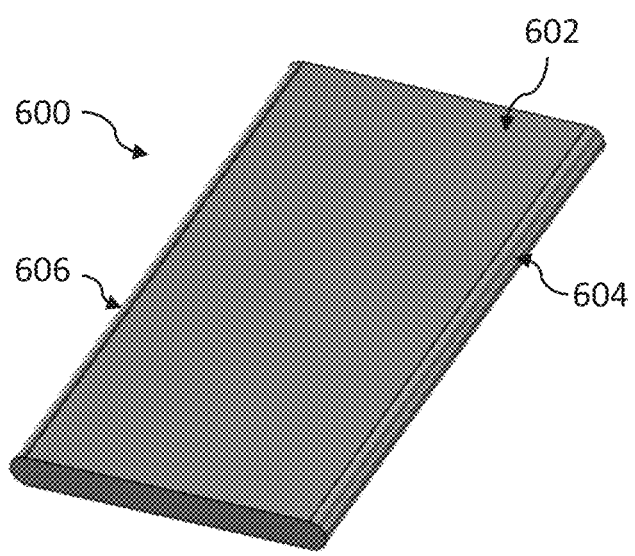
FIGS. 11 and 12 are schematic perspective views of a portable electronic apparatus.
Figure 12:
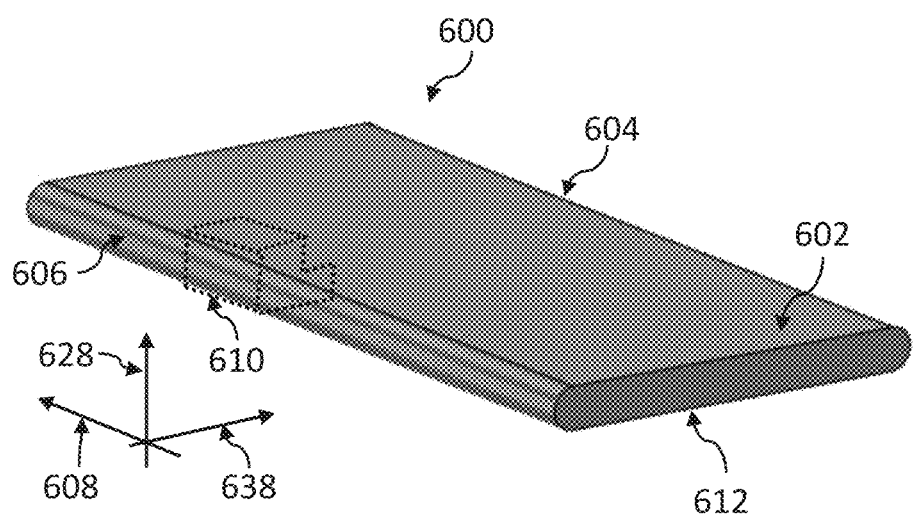

FIGS. 11 and 12 are perspective views of a portable electronic apparatus 600. In the example shown, the portable electronic apparatus 600 is a smartphone. Portable electronic apparatus 600 includes a front panel 602 and back panel 612 (edge of the back panel 612 is visible to the viewer in FIG. 12). Portable electronic apparatus 600 includes an elongate first side ("right edge") 604 and an elongate second side ("left edge") 606, which are elongate along a longitudinal axis 608 and extend between the front panel 602 and the back panel 612 along a transverse axis 628 perpendicular to the longitudinal axis 608. In this example, we wish to configure virtual button(s) at the left edge 606.

Figure 13:
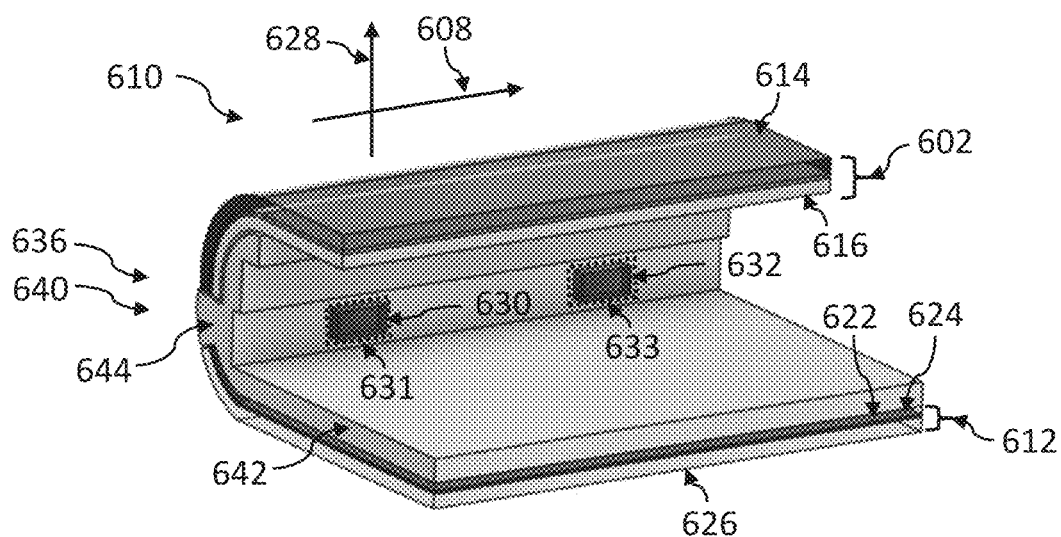
FIG. 13 is a schematic perspective view of a cut-away portion of a portable electronic apparatus, including a force-measuring device assembly, a front panel, and a back panel.
Figure 14:
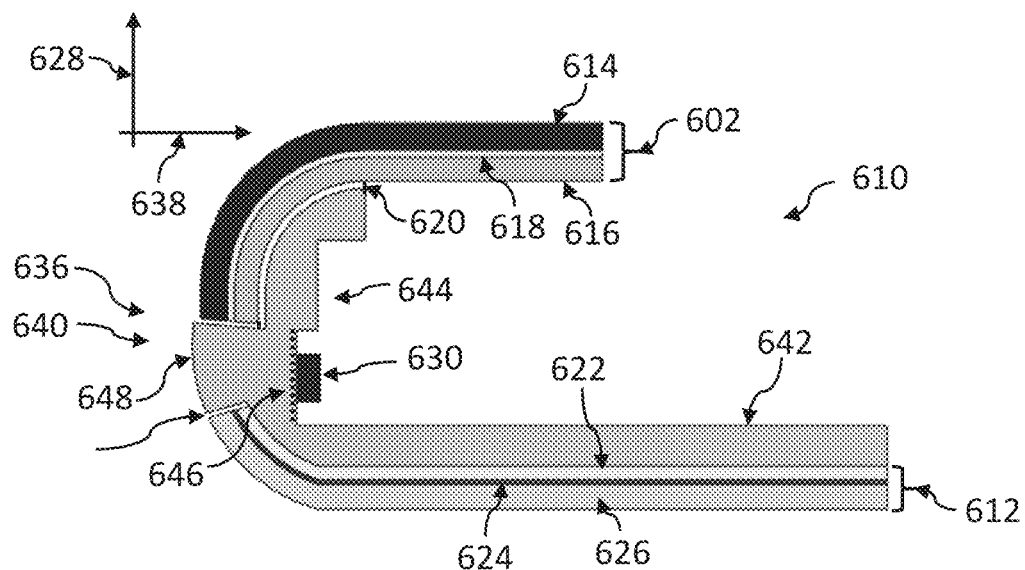
FIG. 14 is a schematic elevational view of the cut-away portion of FIG. 13.

A cut-away portion 610 of the portable electronic apparatus 600 (at the second side 606) is shown in schematic perspective view in FIG. 13 and schematic elevational view in FIG. 14. For ease of viewing, components that are typically present inside a smartphone have been removed from FIGS. 13 and 14. Apparatus portion 610 includes a front panel 602 and a back panel 612. The front panel 602 and the back panel 612 are curved towards each other at the first side 604 and the second side 606. In the example shown, the front panel 602 includes: a glass substrate 614, an adhesive layer 618, and an organic light-emitting diode (OLED) display panel 616. The OLED panel 616 functions as a main display for the portable electronic apparatus 600. The adhesive layer 618 adheres the glass substrate 614 and the OLED display panel 616 together. The glass substrate 614 is the outermost component in the front panel 612. There is another adhesive layer 620 that adheres the front panel 602 to a sidewall portion 644 of the mid-frame 640. The back panel 612 includes: an outermost protective material layer 626 (transparent or translucent, for example), an intermediate decorative layer 624, and an adhesive layer 622. The adhesive layer 622 adheres the back panel 612 and the base portion 642 (of the mid-frame 640) together.

Apparatus 600 includes a force-measuring device assembly 636, which includes a mid-frame 640 and force-measuring devices (630 and 632 are shown in FIG. 13). A portion of the mid-frame 640 is shown in FIG. 13. The mid-frame 640 extends along substantially the entire length of the left edge 606, along longitudinal axis 608. For example, the mid-frame 640 is a single molded plastic component. The mid-frame 640 includes a base portion 642 and a sidewall portion 644. The sidewall portion 644 includes an outer surface 648 facing away from the base portion 642 and an inner surface 646 opposite the outer surface 648. The sidewall portion 644 is elongate along a longitudinal axis 608. The base portion extends along the longitudinal axis 608. When assembled in the portable electronic apparatus 600, the mid-frame 640 is positioned between the front panel 602 and the back panel 612, the outer surface 648 of the sidewall portion 644 is exposed to the outside of the portable electronic apparatus 600, the sidewall portion 644 extends between the front panel 602 and the back panel 612 along a transverse axis 628 perpendicular to the longitudinal axis 608, and the base portion 642 extends along the back panel 612 along a third axis 638 perpendicular to the longitudinal axis 608. The back panel extends 612 along third axis 638 between the left side 606 and the right side 604 (FIG. 14). The base portion 642 can extend along an entirety of the back panel 612 (from the left side 606 to the right side 604) along the third axis 638 or can extend along a portion of the back panel 612. The mid-frame includes the sidewall portion 644 extending away from the base portion 642 along the transverse axis 628 and the base portion 642 extending away from the sidewall portion 644 along the third axis 638. In the example shown, the axes 628 and 638 are approximately perpendicular to each other, or within a range of 75 degrees to 105 degrees to each other. The mechanical deformability of the sidewall portion 644 would be limited by the base portion 642 connected to it.

Each force-measuring device (630, 632) is coupled to the inner surface 646 at a respective contact region (631, 633) and arranged such that the force-measuring devices 630, 632 are separated from each other along the longitudinal axis 608. Each force-measuring device includes at least one strain-sensing element. For example, the strain-sensing element can be a PMFE or a piezoresistive element.

Figure 20:
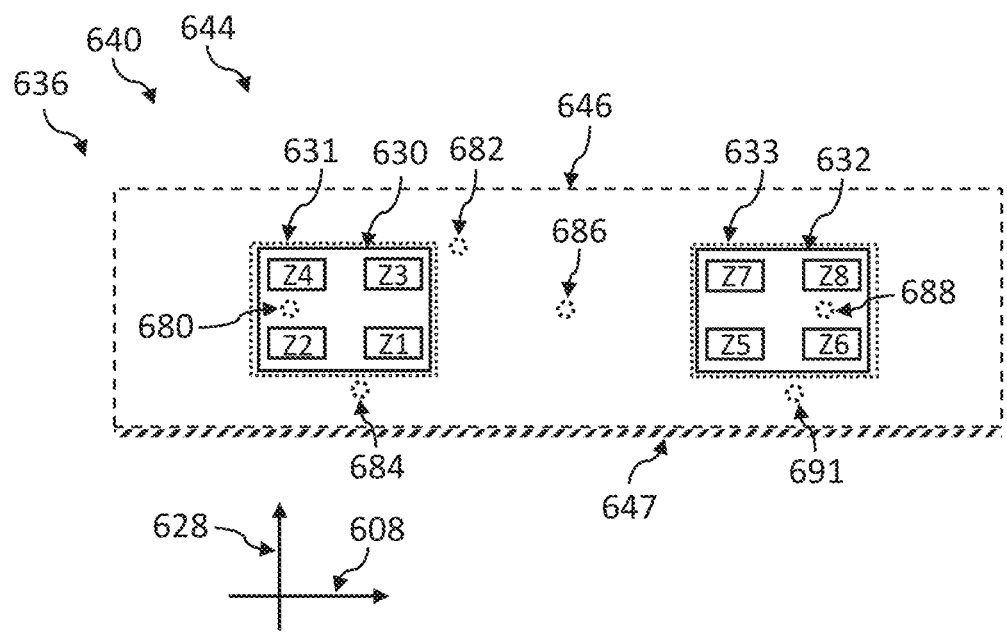
FIG. 20 is a schematic elevational view of an arrangement of force-measuring devices attached to a mid-frame.

A schematic elevational view of an arrangement of force-measuring devices attached to a mid-frame 640 (of force-measuring device assembly 636) is shown in FIG. 20. Force-measuring devices 630, 632 have been attached to the inner surface 646 of the sidewall portion 644 at respective contact regions 631, 633. The base portion 642 abuts the sidewall portion 644 at a boundary 647, shown at the bottom of the inner surface 646. The first force-measuring device 630 includes PMFEs (or PMFE sets): Z1, Z2, Z3, and Z4. The second force-measuring device 632 includes PMFEs (or PMFE sets): Z5, Z6, Z7, and Z8.

Force-imparting points are points at which a touch excitation occurs, e.g., points at which a finger is pressed. The touch excitation can occur at the outer surface 648 when the force-measuring device assembly 636 is assembled into a portable electronic device. Each of the PMFEs is configured to output voltage signals (PMFE voltage signals) in accordance with a time-varying strain at each respective PMFE. Such strain can be caused by a touch event at one of the force-imparting points. Some examples of force-imparting points include: (1) point 680 which overlaps the first force-measuring device 630 (point 680 is located within the first contact region 631); (2) points 682 and 684 which are outside of and close to the first contact region 631; (3) point 686 which is approximately half-way between the adjacent contact regions 631 and 633 (adjacent force-measuring devices 630, 632); and (4) point 688 which overlaps the second force-measuring device 632 (point 688 is located within the second contact region 633). Between points 682 and 684, point 684 is closer to the boundary of the 647 between the sidewall portion 644 and the base portion 642. Since force-imparting point 684 is closer than force-imparting point 682 to the boundary 647, the sidewall portion at point 684 might be less deformable than the sidewall portion at point 682. If there is a large difference between the mechanical deformability at two force-imparting points (e.g., 682, 684), there might be a large difference between the force data generated in response to touch events at the two points.

We define a sense region of the cover layer (in this case, the cover layer is sidewall portion 644) as follows: (1) the force data generated from a particular PMFE in response to a standard touch event (e.g., predetermined duration and force) at force-imparting points within the sense region should be within a predetermined range; and (2) the force data generated from a particular PMFE in response to a standard touch event at force-imparting points outside the sense region should be outside the predetermined range. The foregoing condition (2) is necessary to preclude cross-talk between sense regions. Consider an example of configuring a first sense region to which the first force-measuring device 630 corresponds. Preferably, the first sense region would encompass all force-imparting points (e.g., point 680) within the first contact region 631 and other force-imparting points (e.g., points 682, 684) close to the first contact region 631. Additionally, it might be preferable to configure a second sense region to which the second force-measuring device 632 corresponds. Preferably, the second sense region would encompass all force-imparting points (e.g., point 688) within the second contact region 633 and other force-imparting points (e.g., point 691) close to the second contact region 633. Each of the sense regions could function as a respective virtual button. Furthermore, in order to preclude cross-talk between sense regions, there would be additional force-imparting points, e.g., point 686 located approximately half-way between the two contact regions 631, 633, that would not be included in either sense region.

Figure 22:
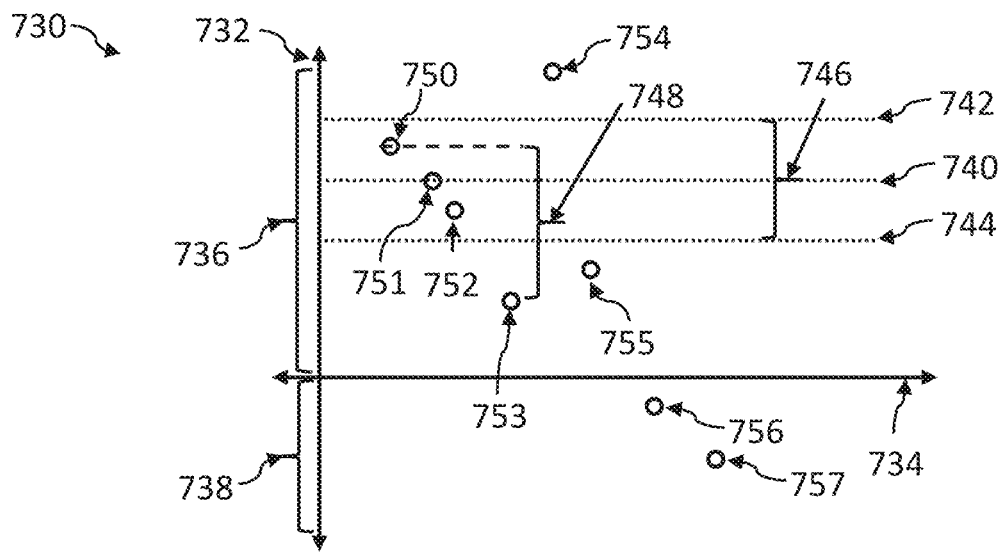
FIG. 22 is a diagram showing a graphical plot of force data for several force-imparting points.

FIG. 22 shows a graphical plot of force data, generated from a particular PMFE (of force-measuring device 630 for example), for several illustrative force-imparting points. Suppose that we obtain force data for the force-imparting points shown in FIG. 20:

TABLE 1

| Force-imparting point | Force data point |
|---|---|
| 680 | 750 |
| 682 | 751 |
| 684 | 753 |
| 686 | 755 |
| 688 | 756 |
| 690 | 757 |

If we were to define a "predetermined range" 748 bounded at the upper end by data point 750 (at force-imparting point 680) and at the lower end by data point 753 (at force-imparting point 684), we would not be able to exclude data point 755 even though data point 755 corresponds to force-imparting point 686, which should be included in neither the first sense region nor the second sense region. The "predetermined range" 748 would be too broad.

In this case, it is necessary to modify a span of the sense region in the force-measuring device assembly.

Figure 15:
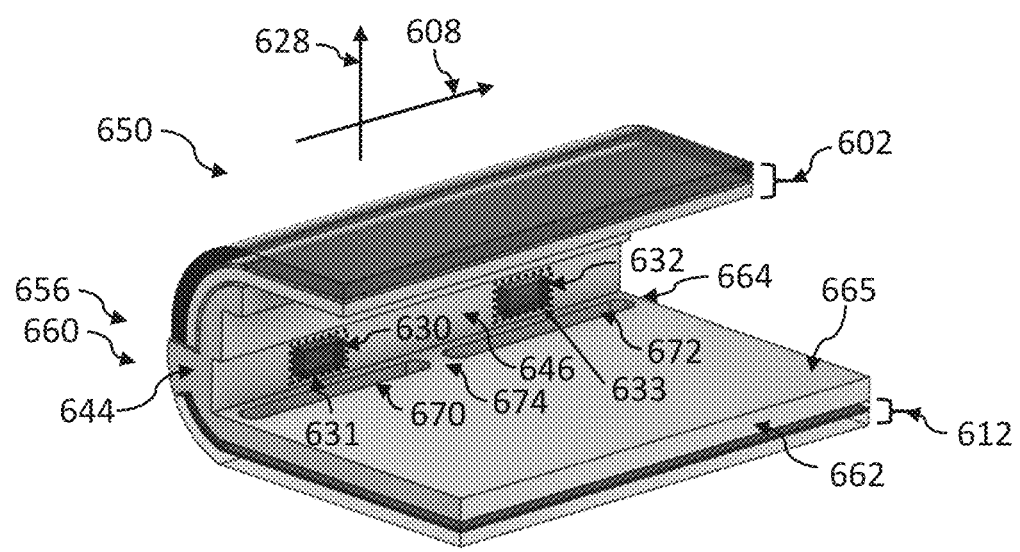
FIG. 15 is a schematic perspective view of a cut-away portion of a portable electronic apparatus, in which the force-measuring device assembly includes elongate slits.
Figure 16:
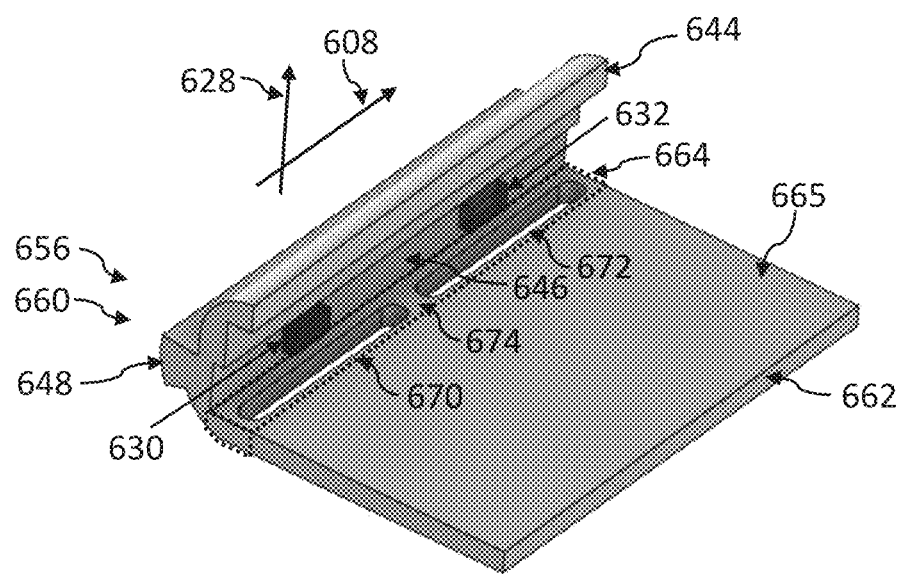
FIGS. 16 and 17 are schematic perspective views of the cut-away portion of the force-measuring device assembly of FIG. 15.
Figure 17:
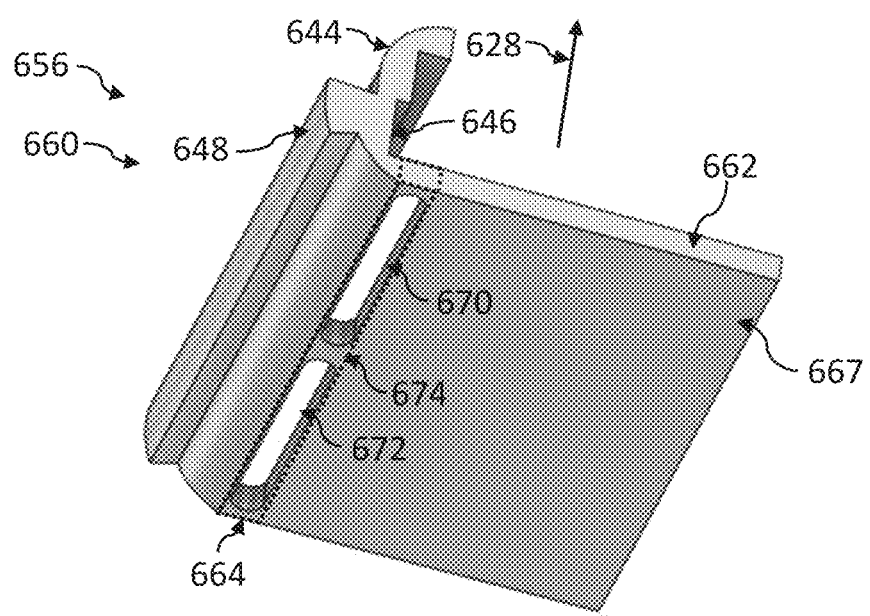

The modification of the span of the sense region is accomplished by using a mid-frame that includes a transition region, including elongate slit(s) or trough(s), between the base portion and the sidewall portion. A cut-away portion 650 of a portable electronic apparatus is shown in schematic perspective view in FIG. 15. A force-measuring device assembly 656 includes a mid-frame 660 and force-measuring devices (630, 632). Force-measuring device assembly 656 and mid-frame 660 are shown in schematic perspective view in FIGS. 16 and 17. The mid-frame 660 differs from mid-frame 640 (FIGS. 13, 14) in that there is a transition region 664 between the base portion 662 and the sidewall portion 644. The transition region 664 extends along the longitudinal axis 608. In the example shown, there are elongate slits 670, 672 located in the transition region 664. The elongate slits 670, 672 are elongate along the longitudinal axis and adjacent slits 670, 672 are separated by a rib 674. FIG. 16 shows a perspective view in which the force-measuring devices 630, 632 and an interior-facing surface 665 of the base portion 662 are visible to the viewer. The interior-facing surface 665 faces away from the back panel 612 when the force-measuring device assembly 656 is assembled into a portable electronic apparatus, as can be seen in FIG. 15. FIG. 17 shows another perspective view in which an exterior-facing surface 667 of the base portion 662 is visible to the viewer. The exterior-facing surface 667 faces towards the back panel 612 when the force-measuring device assembly 656 is assembled into a portable electronic apparatus. In the case of the force-measuring device assembly 656 and the mid-frame 660, the elongate slits 670, 672 penetrate the entire thickness of the transition region 664 (between the interior-facing surface 665 and the exterior-facing surface 667). A boring direction of the elongate slits is along the transverse axis 628.

Figure 18:
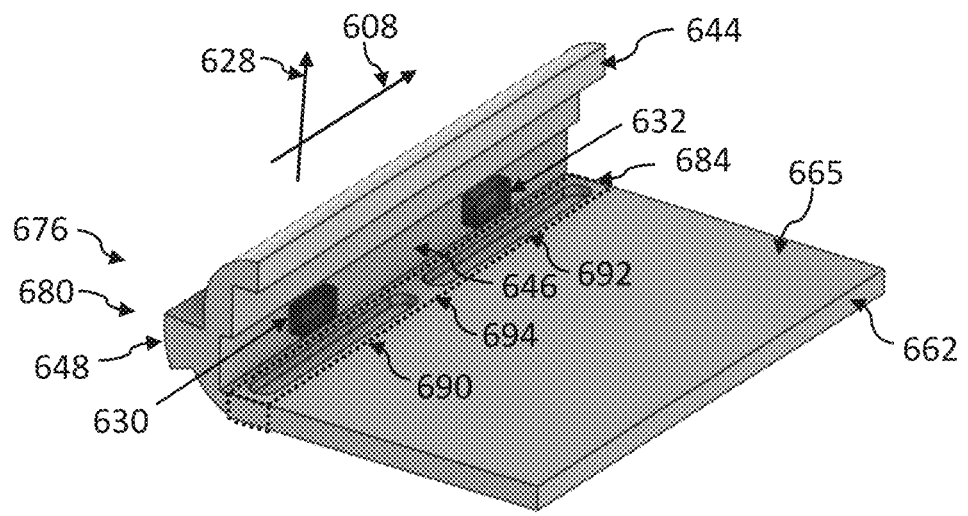
FIG. 18 is a schematic perspective view of a cut-away portion of a force-measuring device assembly including elongate troughs.
Figure 19:
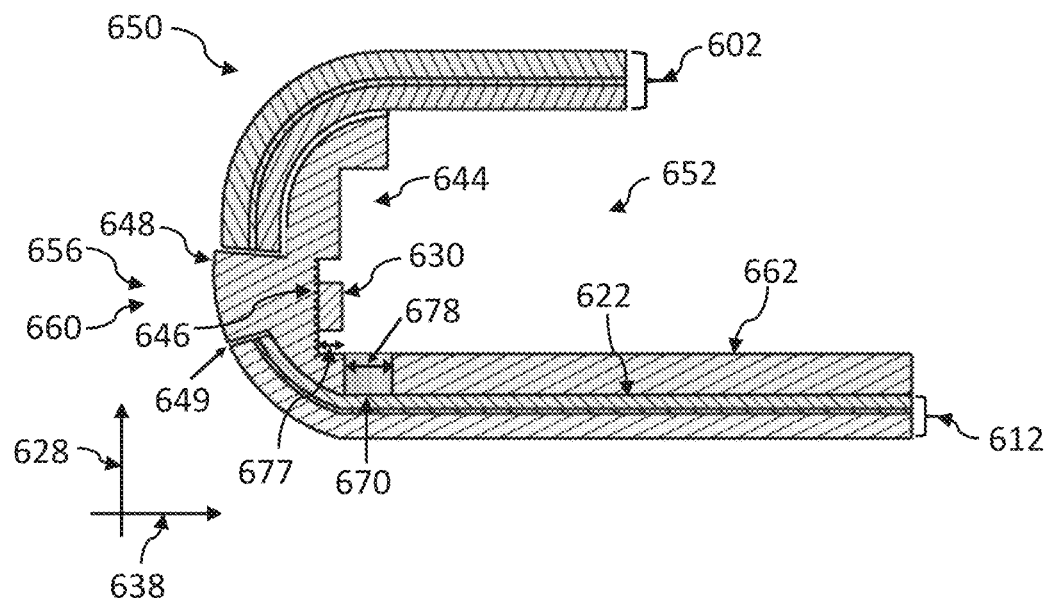
FIG. 19 is a schematic cross-sectional view of a force-measuring device assembly including a slit.

A force-measuring device assembly 676 and a mid-frame 680 are shown in schematic perspective view in FIG. 18. The mid-frame 680 differs from mid-frame 660 (FIGS. 15, 16, and 17) in that the transition region 684 includes elongate troughs 690, 692 instead of elongate slits 670, 672. The elongate troughs 690, 692 do not penetrate the entire thickness of the transition region 684. Nevertheless, a boring direction elongate troughs is along the transverse axis 628. Although there is typically an adhesive layer 622 that adheres the back panel 612 to the base portion 662, liquids from the outside may be able to seep into an interior region 652 of the portable electronic apparatus via a space 649 between the outer surface 648 and the back panel 612 and then through the elongate slit 670 (FIG. 19). In order to prevent this liquid seepage, it may be preferable to use an elongate trough 690 instead of an elongate slit 670.

FIG. 19 is a schematic cross-sectional view of portion 650 of a portable electronic apparatus, including a force-measuring device assembly 656 between a front panel 602 and a back panel 612. The force-measuring device assembly 656 has been explained with reference to FIGS. 15, 16, and 17. This cross section cuts across the elongate slit 670. A distance 677 between the inner surface 646 and a closer edge of the elongate slit 670 (or trough 690) is preferably in a range of 0.1 to 5.0 mm, or preferably in a range of 1.0 to 2.0 mm. A width 678 of the elongate slit 670 (or trough 690) is preferably in a range of 0.5 to 2.0 mm, or preferably in a range of 1.0 to 1.4 mm. In the example shown, a width of the elongate slit or trough is along third axis 638, along which the base portion 662 extends away from the sidewall portion 644.

Figure 21:
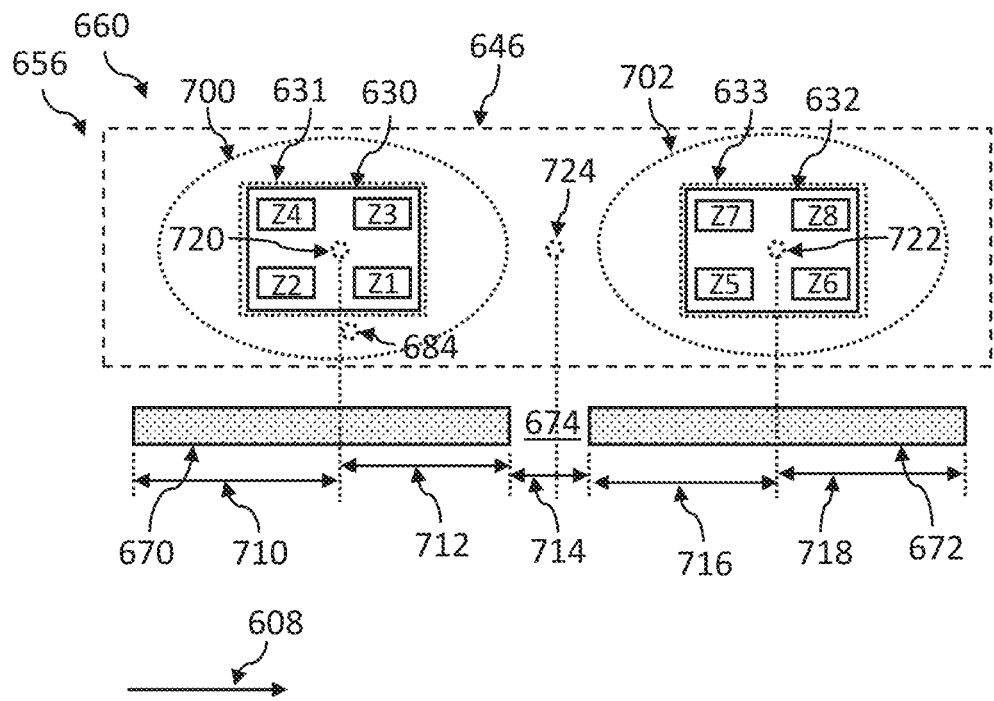
FIG. 21 is a schematic view of an arrangement of force-measuring devices attached to a mid-frame that includes elongate slits or troughs.

FIG. 21 is a schematic view of an arrangement of force-measuring devices 630, 632 attached to a mid-frame that includes elongate slits 670, 672. Force-measuring devices 630, 632 are attached to the inner surface 646 of the sidewall portion 644 at respective contact regions 631, 633. Each force-measuring device 630, 632 corresponds to a respective sense region 700, 702 of the sidewall portion 646. In the example shown, each sense region 700, 702 includes a contact region 631, 633. In the example shown, there is a respective elongate slit 670, 672 for each of the sense regions 700, 702. In other examples, there may be a respective elongate trough 690, 692 for each of the sense regions 700, 702.

A separation distance 714 between adjacent elongate slits 670, 672 (or adjacent elongate troughs) is preferably in a range of 0.5 mm to 2.0 mm, or preferably in a range of 1.0 mm to 1.5 mm. The separation distance 714 can also be regarded as a dimension, along the longitudinal axis 608, of a rib 674 between adjacent elongate slits or troughs. FIG. 21 shows a center 720, 722 of each of the force-measuring devices 630, 632. In the example shown, points 720, 722 are also center points of the respective sense regions 700, 702. For force-measuring device 630, the respective elongate slit 670 (or trough) preferably extends at least 3.0 mm, or at least 6.5 mm, from the center 720 of the force-measuring device 630 in at least one direction along the longitudinal axis 608. Accordingly, distance 710 and/or distance 712 is preferably at least 3.0 mm, or at least 6.5 mm. For force-measuring device 632, the respective elongate slit 672 (or trough) preferably extends at least 3.0 mm, or at least 6.5 mm, from the center 722 of the force-measuring device 632 in at least one direction along the longitudinal axis 608. Accordingly, distance 716 and/or distance 718 is preferably at least 3.0 mm, or at least 6.5 mm. FIG. 21 shows a mid-point 724 between the adjacent force-measuring devices 630, 632. In the example shown, the rib 674 is located at a longitudinal position corresponding to the mid-point 724.

The force data generated from a particular PMFE in response to a standard touch event at force-imparting points within the first sense region 700 are within a preferred range 746 (FIG. 22). In the case of the configuration shown in FIG. 21, data point 752 which is the force data for force-imparting point 684, is within the preferred range 746. Data points within the preferred range are of the same polarity and vary by a predetermined percentage (or other suitable quantity) from an average force data. Preferably, force data obtained for force-imparting points within a sense region are within a preferred range. In the example shown, the preferred range 746 ranges between an upper bound 742 and a lower bound 744. Preferably, the force data are of the same polarity as and vary by 50% or less from an average force data for the sense region within the predetermined range 746 are of the same polarity as an average force data.

Figure 23:
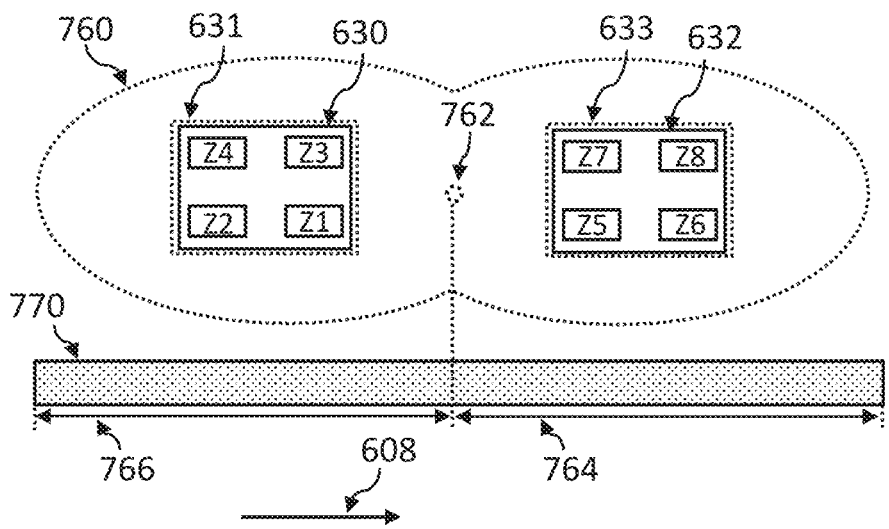
FIG. 23 is a schematic view of an arrangement of force-measuring devices attached to a mid-frame that includes one elongate slit or trough.

FIG. 23 is a schematic view of an arrangement of force-measuring devices attached to a mid-frame that includes an elongate slit or trough. In the example shown, both force-measuring devices 630, 632 correspond to one sense region 760. Sense region 760 includes two contact regions 631, 633. There is a respective elongate slit or trough (e.g., 770) for each sense region (760). The elongate slits or troughs are elongate along the longitudinal axis 608. An advantage to the concept shown in FIG. 23 is that larger sense regions (larger virtual buttons) spanning multiple force-measuring devices can be made. Point 762 is a center of the sense region 760. For sense region 760, the respective elongate slit 770 (or trough) preferably extends at least 3.0 mm, or at least 6.5 mm, from the center 762 of the sense region 760 in at least one direction along the longitudinal axis 608. Accordingly, distance 764 and/or distance 766 is preferably at least 3.0 mm, or at least 6.5 mm.

Figure 24:
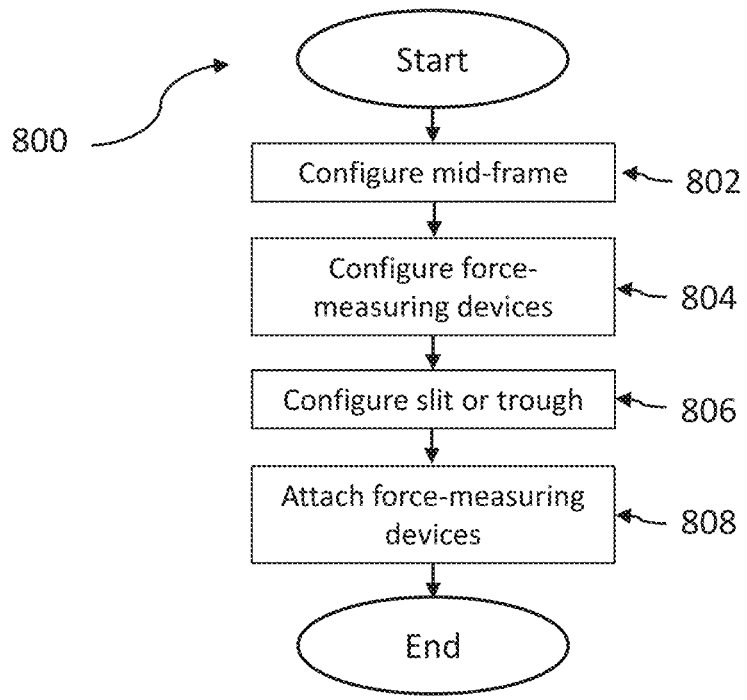
FIG. 24 is a flow diagram of a method of modifying a span of a sense region in a force-measuring device assembly.

FIG. 24 is a flow diagram of a method 800 of modifying a span of a sense region in a force-measuring device assembly. Method 800 includes steps 802, 804, 806, and 808. Step 802 includes configuring a mid-frame including a base portion, a sidewall portion, and a transition region between the base portion and the sidewall portion. The sidewall portion includes an outer surface facing away from the base portion and an inner surface opposite the outer surface. The sidewall portion and the transition region are elongate along a longitudinal axis. The base portion extends along the longitudinal axis. The sidewall portion extends along a transverse axis perpendicular to the longitudinal axis.

Step 804 includes configuring a plurality of force-measuring devices. Each of the force-measuring devices includes at least one strain-sensing element configured to output voltage signals in accordance with a time-varying strain at each respective strain-sensing element. Step 806 includes configuring a respective elongate slit or trough in the transition region for each of the sense regions. The respective elongate slit or trough is elongate along the longitudinal axis. Adjacent elongate slits or troughs are separated by a respective rib. Step 808 includes coupling each of the force-measuring devices to the inner surface at a respective contact region of the sidewall portion adjacent to the respective elongate slit or trough and arranging the force-measuring devices such that they are separated from each other along the longitudinal axis. Each of the sense regions includes one or more contact regions.

What is claimed is:

1. A force-measuring device assembly for a portable electronic apparatus, comprising:
a mid-frame comprising a base portion, a sidewall portion, and a transition region between the base portion and the sidewall portion, the sidewall portion comprising an outer surface facing away from the base portion and an inner surface opposite the outer surface, the sidewall portion and the transition region being elongate along a longitudinal axis, the base portion extending along the longitudinal axis, the sidewall portion extending along a transverse axis perpendicular to the longitudinal axis; and
a plurality of force-measuring devices, each of the force-measuring devices coupled to the inner surface at a respective contact region of the sidewall portion and arranged such that the force-measuring devices are separated from each other along the longitudinal axis, each of the force-measuring devices comprising at least one strain-sensing element configured to output voltage signals in accordance with a time-varying strain at each respective strain-sensing element, each of the force-measuring devices corresponding to a respective sense region of the sidewall portion, each of the sense regions comprising one or more contact regions;
wherein the transition region comprises a respective elongate slit or trough for each of the sense regions, the respective elongate slit or trough being elongate along the longitudinal axis, adjacent elongate slits or troughs being separated by a respective rib.

2. The force-measuring device assembly of claim 1, wherein the at least one strain-sensing element is a piezoelectric micromechanical force-measuring element (PMFE) or a piezoresistive element.

3. The force-measuring device assembly of claim 1, wherein:
when assembled in the portable electronic apparatus comprising a front panel and a back panel, the mid-frame is positioned between the front panel and the back panel, the outer surface of the sidewall portion is exposed to the outside of the portable electronic apparatus, the transition region and the base portion are not exposed to the outside of the portable electronic apparatus, the sidewall portion extends between the front panel and the back panel along the transverse axis, and the base portion extends along the back panel.

4. The force-measuring device assembly of claim 1, wherein a distance between the inner surface and a closer edge of at least one of the elongate slits or troughs is in a range of 0.1 to 5.0 mm.

5. The force-measuring device assembly of claim 4, wherein the distance is in a range of 1.0 to 2.0 mm.

6. The force-measuring device assembly of claim 1, wherein a width of at least one of the elongate slits or troughs is in a range of 0.5 to 2.0 mm.

7. The force-measuring device assembly of claim 6, wherein the width is in a range of 1.0 to 1.4 mm.

8. The force-measuring device assembly of claim 1, wherein a separation distance between adjacent ones of the elongate slits or troughs is in a range of 0.5 mm to 2.0 mm.

9. The force-measuring device assembly of claim 8, wherein the separation distance is in a range of 1.0 mm to 1.5 mm.

10. The force-measuring device assembly of claim 1, wherein for at least one of the sense regions, the respective elongate slit or trough extends at least 3.0 mm from a center of the at least one sense region in at least one direction along the longitudinal axis.

11. The force-measuring device assembly of claim 10, wherein the respective elongate slit or trough extends at least 6.5 mm from the center in at least one direction along the longitudinal axis.

12. The force-measuring device assembly of claim 1, wherein for at least one of the force-measuring devices, the respective elongate slit or trough extends at least 3.0 mm from a center of the force-measuring device in at least one direction along the longitudinal axis.

13. The force-measuring device assembly of claim 12, wherein the respective elongate slit or trough extends at least 6.5 mm from the center in at least one direction along the longitudinal axis.

14. The force-measuring device assembly of claim 1, wherein at least one of the ribs is located at a longitudinal position corresponding to a mid-point between adjacent ones of the force-measuring devices.

15. The force-measuring device assembly of claim 1, wherein a boring direction of the respective elongate slit or trough is along the transverse axis.

16. The force-measuring device assembly of claim 1, wherein for at least one of the sense regions, force data obtained from the voltage signals of the respective strain-sensing element(s) corresponding to the sense region in response to a predetermined touch excitation to the outer surface at any force-imparting point within the sense region are of the same polarity as and vary by 50% or less from an average of the force data for the sense region.

17. A portable electronic apparatus, comprising:
a front panel comprising a main display;
a back panel;
a mid-frame positioned between the front panel and the back panel, comprising a base portion, a sidewall portion, and a transition region between the base portion and the sidewall portion, the sidewall portion comprising an outer surface facing away from the base portion and an inner surface opposite the outer surface, the sidewall portion and the transition region being elongate along a longitudinal axis, the base portion extending along the longitudinal axis and along the back panel, the sidewall portion extending between the front panel and the back panel along a transverse axis perpendicular to the longitudinal axis; and
a plurality of force-measuring devices, each of the force-measuring devices coupled to the inner surface at a respective contact region of the sidewall portion and arranged such that the force-measuring devices are separated from each other along the longitudinal axis, each force-measuring device comprising at least one strain-sensing element configured to output voltage signals in accordance with a time-varying strain at each respective strain-sensing element, each of the force-measuring devices corresponding to a respective sense region of the sidewall portion, each of the sense regions comprising one or more contact regions;
wherein the transition region comprises a respective elongate slit or trough for each of the sense regions, the respective elongate slit or trough being elongate along the longitudinal axis, adjacent elongate slits or troughs being separated by a respective rib; and
wherein the outer surface of the sidewall portion is exposed to the outside of the portable electronic apparatus and the transition region and the base portion are not exposed to the outside of the portable electronic apparatus.

18. The portable electronic apparatus of claim 17, wherein the at least one strain-sensing element is a piezoelectric micromechanical force-measuring element (PMFE) or a piezoresistive element.

19. The portable electronic apparatus of claim 17, wherein for at least one of the sense regions, force data obtained from the voltage signals of the respective strain-sensing element(s) corresponding to the sense region in response to a predetermined touch excitation to the outer surface at any force-imparting point within the sense region are of the same polarity as and vary by 50% or less from an average of the force data for the sense region.

20. A method of modifying a span of a sense region in a force-measuring device assembly, comprising:
(A) configuring a mid-frame comprising a base portion, a sidewall portion, and a transition region between the base portion and the sidewall portion, the sidewall portion comprising an outer surface facing away from the base portion and an inner surface opposite the outer surface, the sidewall portion and the transition region being elongate along a longitudinal axis, the base portion extending along the longitudinal axis, the sidewall portion extending along a transverse axis perpendicular to the longitudinal axis;
(B) configuring a plurality of force-measuring devices, each of the force-measuring devices comprising at least one strain-sensing element configured to output voltage signals in accordance with a time-varying strain at each respective strain-sensing element;
(C) configuring a respective elongate slit or trough in the transition region for each of the sense regions, the respective elongate slit or trough being elongate along the longitudinal axis, adjacent elongate slits or troughs being separated by a respective rib; and (D) coupling each of the force-measuring devices to the inner surface at a respective contact region of the sidewall portion adjacent to the respective elongate slit or trough and arranging the force-measuring devices such that they are separated from each other along the longitudinal axis, each of the sense regions comprising one or more contact regions.

21. The method of claim 20, wherein the at least one strain-sensing element is a piezoelectric micromechanical force-measuring element (PMFE) or a piezoresistive element.

22. The method of claim 20, wherein a distance between the inner surface and a closer edge of at least one of the elongate slits or troughs is in a range of 0.1 to 5.0 mm.

23. The method of claim 22, wherein the distance is in a range of 1.0 to 2.0 mm.

24. The method of claim 20, wherein a width of at least one of the elongate slits or troughs is in a range of 0.5 to 2.0 mm.

25. The method of claim 24, wherein the width is in a range of 1.0 to 1.4 mm.

26. The method of claim 20, wherein a separation distance between adjacent ones of the elongate slits or troughs is in a range of 0.5 mm to 2.0 mm.

27. The method of claim 26, wherein the separation distance is in a range of 1.0 mm to 1.5 mm.

28. The method of claim 20, wherein for at least one of the sense regions, the respective elongate slit or trough extends at least 3.0 mm from a center of the sense region in at least one direction along the longitudinal axis.

29. The method of claim 28, wherein the respective elongate slit or trough extends at least 6.5 mm from the center of the sense region at least one direction along the longitudinal axis.

30. The method of claim 20, wherein for at least one of the force-measuring devices, the respective elongate slit or trough extends at least 3.0 mm from a center of the force-measuring device in at least one direction along the longitudinal axis.

31. The method of claim 30, wherein the respective elongate slit or trough extends at least 6.5 mm from the center in at least one direction along the longitudinal axis.

32. The method of claim 20, wherein at least one of the ribs is located at a longitudinal position corresponding to a mid-point between adjacent ones of the force-measuring devices.

33. The method of claim 20, wherein a boring direction of the respective elongate slit or trough is along the transverse axis.

* * * * *